United States Patent
May et al.

(10) Patent No.: US 7,246,027 B2
(45) Date of Patent: Jul. 17, 2007

(54) POWER OPTIMIZATION OF A MIXED-SIGNAL SYSTEM ON AN INTEGRATED CIRCUIT

(75) Inventors: Marcus W. May, Austin, TX (US); Matthew D. Felder, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 11/078,150

(22) Filed: Mar. 11, 2005

(65) Prior Publication Data

US 2006/0217920 A1    Sep. 28, 2006

(51) Int. Cl.
*G01K 1/00*    (2006.01)

(52) U.S. Cl. .................................................. 702/130

(58) Field of Classification Search ................ 702/130, 702/117, 121, 124, 60, 64; 377/19, 20; 438/14, 438/17, 18
See application file for complete search history.

(56) References Cited

U.S. PATENT DOCUMENTS 5,563,928 A * 10/1996 Rostoker et al. ............. 377/20

* cited by examiner

*Primary Examiner*—John Barlow
*Assistant Examiner*—Xiuqin Sun
(74) *Attorney, Agent, or Firm*—Garlick Harrison & Markison; Kevin L. Smith

(57) ABSTRACT

A method and apparatus for conserving power of a mixed-signal system-on-a-chip having analog circuitry, involving determination of an analog variation parameter that is representative of an integrated circuit fabrication process variance of the integrated circuit, and an operational temperature associated with the analog variation parameter. With the analog variation parameter and the operational temperature, an adjustment signal is determined for a power supply level of the integrated circuit, such that power consumption of the integrated circuit is optimized. Further, in mixed-signal integrated circuits with digital and analog circuitry, a digital variation parameter is determined, where the adjustment signal determination is based on the digital variation parameter and the analog variation parameter with respect to the operational temperature. With such a method and apparatus, power consumption is optimized on an IC-by-IC basis such that power consumption of each IC is optimized.

21 Claims, 10 Drawing Sheets multiple function battery operated device 60

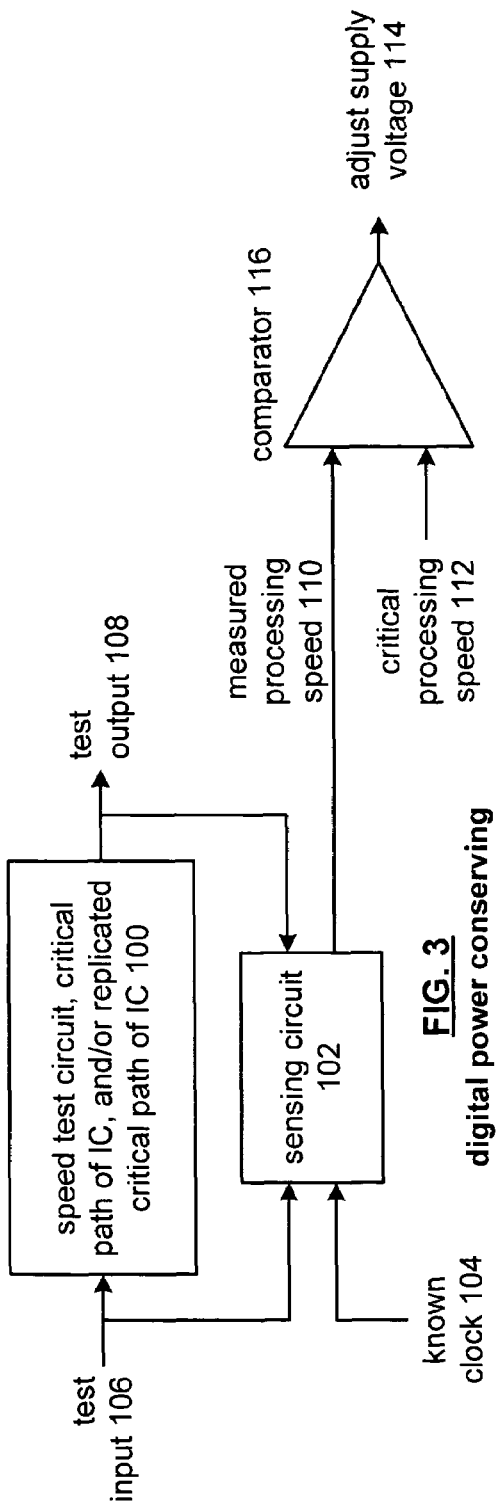
FIG. 3
digital power conserving circuit 92
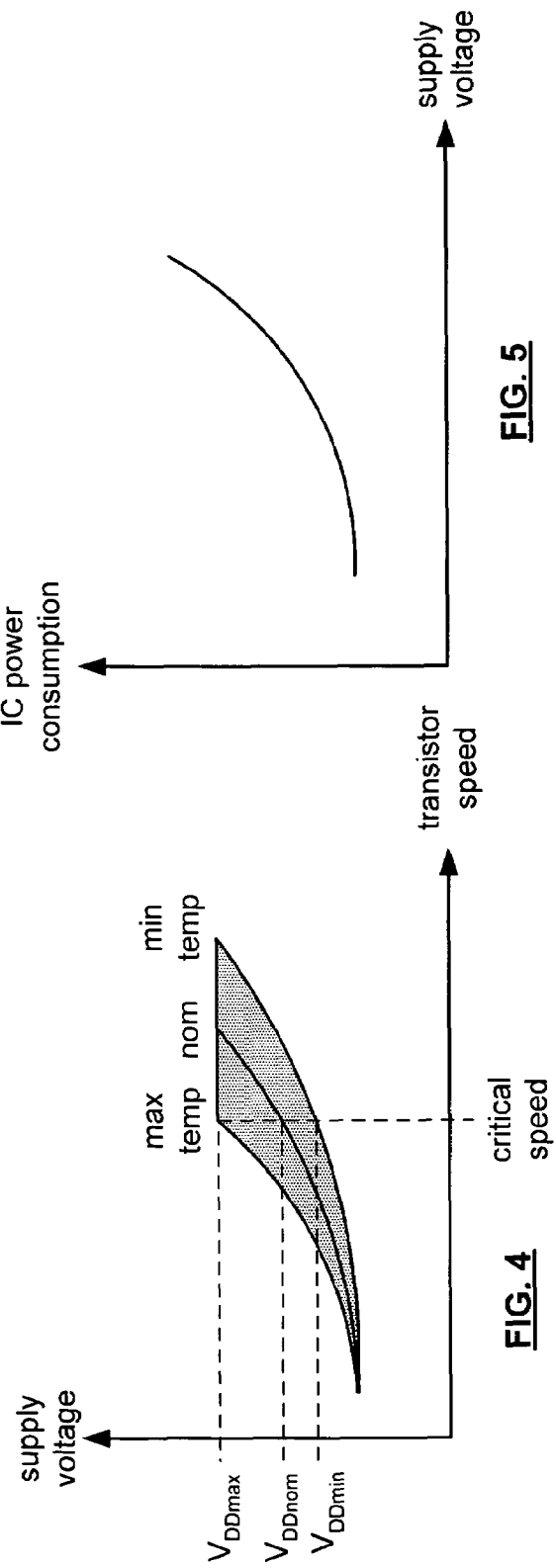
FIG. 5
FIG. 4

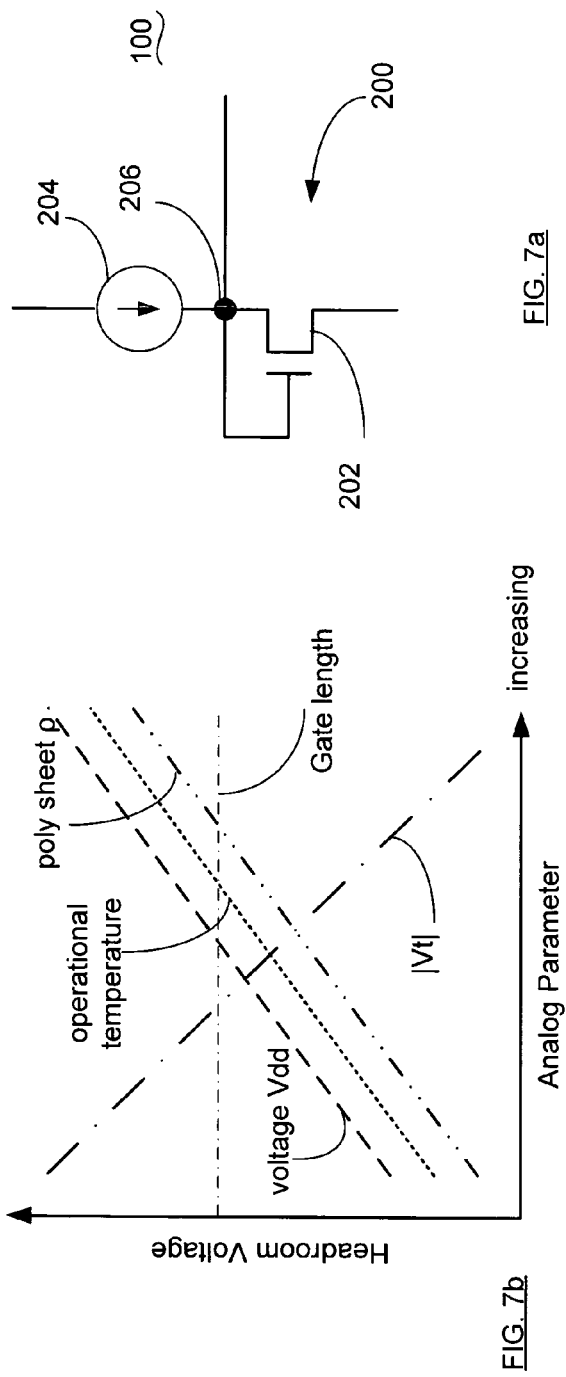
FIG. 7a
FIG. 7b
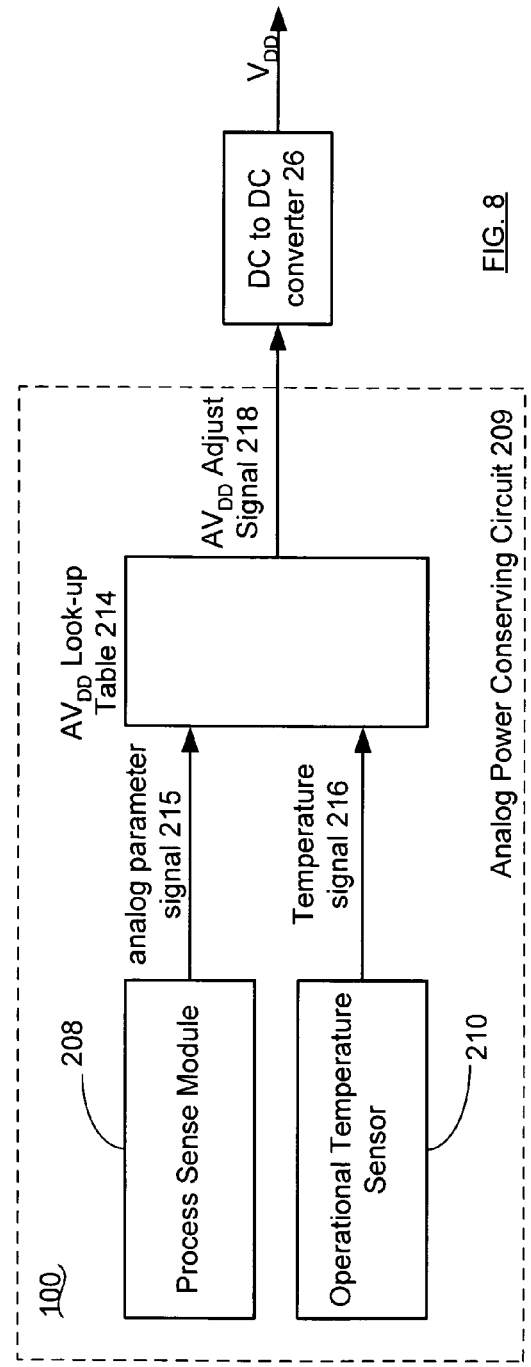
FIG. 8 power conserving circuit 250

POWER OPTIMIZATION OF A MIXED-SIGNAL SYSTEM ON AN INTEGRATED CIRCUIT

TECHNICAL FIELD

This invention relates generally to portable electronic equipment and more particularly to a sensing digital and analog parameters of an integrated circuit to provide power supply optimization.

BACKGROUND

As is known, integrated circuits are used in a wide variety of electronic equipment, including portable, or handheld, devices. Such handheld devices include personal digital assistants (PDA), CD players, MP3 players, DVD players, AM/FM radio, a pager, cellular telephones, computer memory extension (commonly referred to as a thumb drive), etc. These handheld devices include one or more integrated circuits to provide the functionality of the device. For example, a thumb drive may include an integrated circuit for interfacing with a computer (for example, personal computer, laptop, server, workstation, etc.) via one of the ports of the computer (for example, Universal Serial Bus, parallel port, etc.) and at least one other memory integrated circuit (for example, flash memory). As such, when the thumb drive is coupled to a computer, data can be read from and written to the memory of the thumb drive. Accordingly, a user may store personalized information (for example, presentations, Internet access account information, etc.) on his/her thumb drive and use any computer to access the information.

As another example, an MP3 player may include multiple integrated circuits to support the storage and playback of digitally formatted audio (that is, formatted in accordance with the MP3 specification). As is known, one integrated circuit may be used for interfacing with a computer, another integrated circuit for generating a power supply voltage, another for processing the storage and/or playback of the digitally formatted audio data, and still another for rendering the playback of the digitally formatted audio.

Integrated circuit technology has led to a plethora of handheld devices; however, to be "wired" in today's electronic world, multiple handheld devices would be needed. For example, one may own a cellular telephone for cellular telephone service, a PDA for scheduling, address book, etc., one or more thumb drives for extended memory functionality, an MP3 player for storage and/or playback of digitally recorded music, a radio, etc. Thus, even though a single handheld device may be relatively small, carrying multiple handheld devices on one's person can become quite burdensome.

Such handheld devices use a battery (or batteries) to supply power to the circuitry of the device. The greater the circuit power consumption, the shorter the battery life (that is, the length of time a device can be operated before having to replace or charge the battery).

With the goal of extending battery lifespan for portable devices, various techniques had been used. One technique has been to turn off circuitry that is not needed to support the present function and to put the device in a "sleep" mode when the entire device is not in use.

Another technique is related to improvements in integrated circuit fabrication that allows for smaller devices to be developed and to be operated at lower voltages, thus consuming less power. For example, 0.18 micron Complementary Metal Oxide Semiconductor ("CMOS") integrated circuit technology is currently the most accepted process, which uses supply voltages of 1.8 volts. Several years ago, however, 0.35 micron and 0.50 micron CMOS integrated circuit technologies were the prevalent processes, which could use supply voltages of about 3.3 volts. In the near future, 0.10 and 0.13 micron CMOS integrated circuit technology will likely become the technology of choice because of lower supply voltages of about 1.0 volts.

While these design techniques worked to reduce power consumption generally, they had been designed assuming the worst-case operation of an integrated circuit. As such, integrated circuit circuits would be consuming more power than needed because the power reducing techniques were under a worst-case assumption and not individually optimized on a chip-by-chip basis.

Generally, digital components and analog components are operated under different processes, techniques, or parameters for their desired functional results. Because digital component operation is based on clock speed, and analog component operation is based on bias factors such as threshold voltage, different operational parameters or conditions may be more favorable for one over the other. For example, lower operational temperatures raise the threshold voltage level for analog components, affecting signal performance, while favorable for digital component operation. Conversely, higher operational temperatures lower the threshold voltage level for analog components, while slowing digital gate response for digital components. Accordingly, power consumption considerations for each type of component would differ.

Therefore, a need exists for an integrated circuit that provides multiple functions through mixed-signal operation and architectures for handheld devices with appropriate optimized power-consumption and with a minimal requirement of external components.

SUMMARY

Provided is a method and apparatus for conserving power of a system-on-a-chip having analog circuitry. An aspect is a method and apparatus for increasing the power supply efficiency of an integrated circuit, by determining an analog variation parameter that is representative of an integrated circuit fabrication process variance of the integrated circuit. An operational temperature is determined, where the operational temperature is associated with the analog variation parameter. With the analog variation parameter and the operational temperature, an adjustment signal is determined for a power supply level of the integrated circuit, such that power consumption of the integrated circuit is optimized.

A further aspect involves determining a digital variation parameter, and determining the adjustment signal based on the digital variation parameter and the analog variation parameter with respect to the operational temperature. The digital variation parameter is determined by using a speed sensing technique, which begins by measuring the processing speed of at least a portion of an integrated circuit ("IC") to produce measured processing speed. The portion of the IC may be a test circuit, a critical path of the IC, and/or a replica of the critical path of the IC. The processing continues by comparing the measured processing speed with a critical processing speed for the at least a portion of the integrated circuit. The processing then continues by adjusting supply voltage to the integrated circuit to reduce power consumption of the integrated circuit when the measured processing speed compares favorably to the critical processing speed.

With such a method and apparatus, power consumption is optimized on an IC-by-IC basis, as well as over time.

DESCRIPTION OF THE DRAWINGS

FIG. 3 is a schematic block diagram of a power conserving circuit in accordance with the present invention;

FIG. 4 is a graph of supply voltage versus transistor speed in accordance with the present invention;

FIG. 5 is a graph of integrated circuit power consumption versus supply voltage in accordance with the present invention;

FIG. 7a is a schematic of a process sensing channel in accordance with the present invention;

FIG. 7b illustrates a graph that plots interrelationships of fabrication parameter corners versus headroom voltage in accordance with the present invention;

FIG. 8 is a schematic block diagram of an analog power conservation circuit in accordance with the present invention;

DETAILED DESCRIPTION

Figure 1:
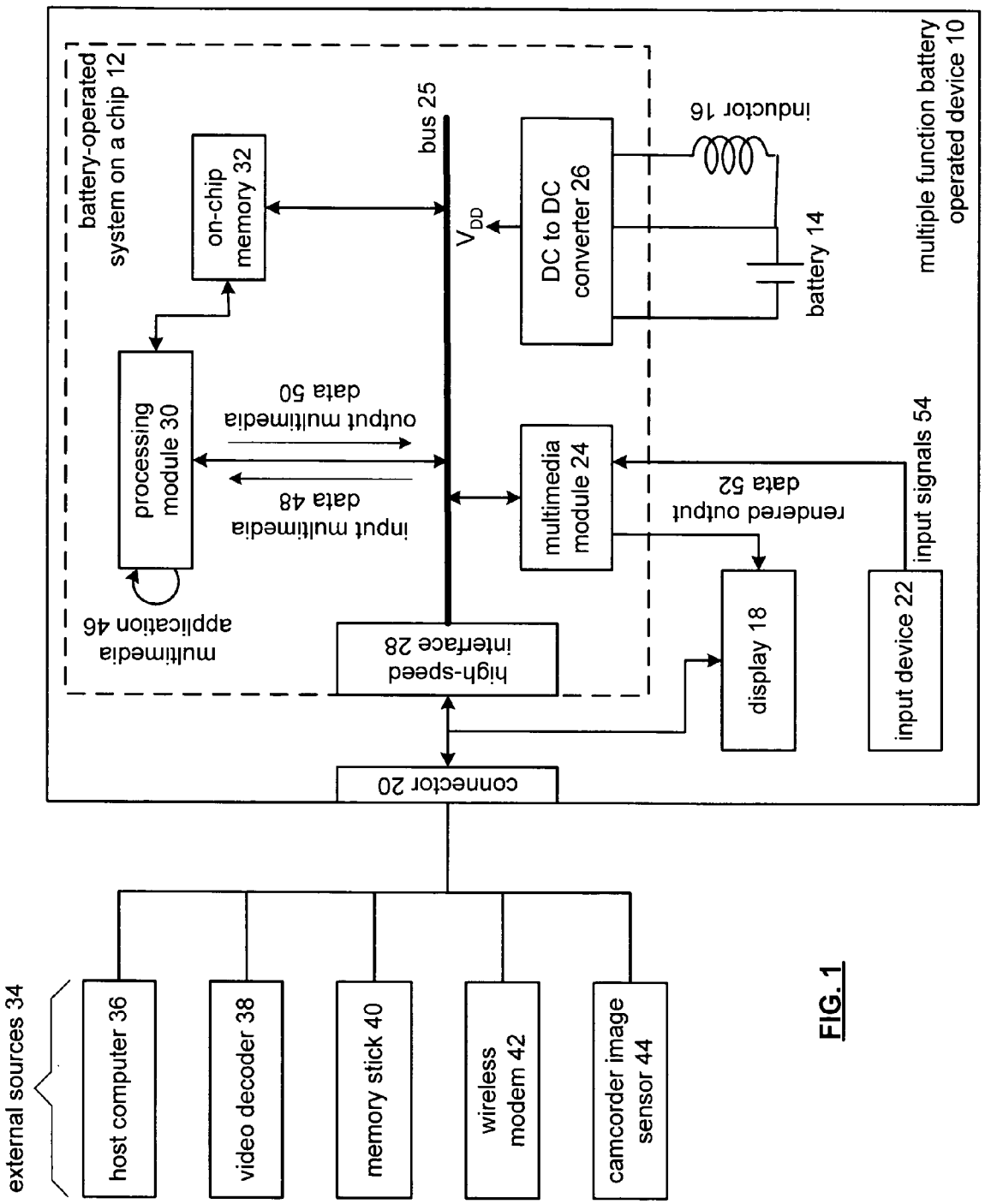
FIG. 1 is a schematic block diagram of a multiple function battery operated device that includes a battery-optimized system-on-a-chip in accordance with the present invention.

FIG. 1 is a schematic block diagram of a multiple function battery operated device 10 that includes a battery-optimized system-on-a-chip 12, a battery 14, an inductor 16, a display 18, a connector 20, and an input device 22. The multiple function battery operated device 10 may also be referred to as a handheld device. The connector 20 provides coupling between the battery-optimized system-on-a-chip 12 and external sources 34, which may be a host computer 36, a video decoder 38, a memory stick 40, a wireless modem 42, a camcorder image sensor 44. The battery-optimized system-on-a-chip 12 includes a multimedia module 24, a high-speed interface 28, a processing module 30, on-chip memory 32, and an on-chip DC-to-DC converter 26. In general, the multiple function battery operated device 10 may be, but is not limited to, an MP3 player/recorder, a thumb drive memory extension, a digital camera, a digital camcorder, a DVD player/recorder, video conferencing device, a personal digital assistant ("PDA"), a radio, a television, and/or a CD player/recorder.

The DC-to-DC converter 26 is operably coupled to the battery 14 and inductor 16 to produce at least one supply voltage ($V_{DD}$). In general, the DC-to-DC converter may be a buck converter, a boost converter, a fly-back converter, a half bridge converter, and/or a full bridge converter. Note that the DC-to-DC converter can also be an inductor-less configuration including a linear regulator and/or a switched-capacitor regulator. In one embodiment, the DC-to-DC converter is a boost converter that includes a sink transistor, at least one load transistor, and regulation circuitry. The regulation circuitry monitors the supply voltage ($V_{DD}$) with respect to a reference voltage and produces therefrom a regulation signal. The regulation signal, in one phase, enables the sink transistor to build up energy in the inductor and, in another phase, enables the load transistor to transfer the energy of the inductor to the supply voltage. The DC-to-DC converter 26 may be constructed in accordance with the teaching of U.S. Pat. No. 6,204,651, entitled METHOD AND APPARATUS FOR REGULATING A DC VOLTAGE, which is hereby incorporated by reference, and provides the supply voltage the processing module 30, the on-chip memory 32, the high-speed interface 28, and/or the multimedia module 24. The DC-to-DC converter 26 may also provide the supply voltage off-chip to power the display 18 and/or the input device 22.

The high-speed interface 28 is operably coupled to bus 25 within the system-on-a-chip 12 and externally via the connector 20. As such, the high-speed interface 28, which may be a universal serial bus ("USB") interface, a serial-to-deserial interface, or parallel interface, provides connectivity between one or more external sources 34 and the system-on-a-chip 12. For example, the host computer 36, which may be a personal computer, laptop, workstation, etc., provides digitized audio (for example, an MP3 file, WMA—Windows Media Architecture—, MP3 PRO, Ogg Vorbis, AAC—Advanced Audio Coding, a CD file, etc.) and/or digitized video signals (for example, an MPEG (motion picture expert group) file, a JPEG (joint photographic expert group) file, a DVD file, a video graphics file, a text file, etc.) to the high-speed interface 28. The high-speed interface 28 converts the format of the received data into a generic format of the system-on-a-chip, which is based on the type of processing module 30 and/or the type of on-chip memory 32.

The high-speed interface then provides the generic formatted data to the processing module 30, the on-chip memory 32, and/or the multimedia module 24. For instance, the digitalized audio and/or video data may be stored in the on-chip memory 32 for later playback, where the processing module 30 controls the storing of the data via a multimedia application 46. Note that processing module 30 may be a single processing device or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

The on-chip memory 32 may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module 30 implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. The memory 32 stores, and the processing module 30 executes, operational instructions corresponding to multimedia applications 46 that include, but are not limited to audio playback, audio record, video playback, video record, storing text, displaying text, storing video graphics, file system transfer, and/or displaying video graphics.

The data that is stored in the on-chip memory 32 may be subsequently retrieved under the control of the processing module 30 while executing a multimedia application 46 to render the data audible and/or visible. In this instance, the processing module 30 causes the data to be retrieved from the on-chip memory 32 and to be provided to the multimedia module 24. The multimedia module 24 processes the data to produce rendered output data 52, which may include analog audio signals, digital audio signals, analog video signals, digital video signals, text, and/or video graphics, and provides the rendered output data 52 to the display 18. The display 18, which may be a headphone jack, a speaker or speakers, a Liquid Crystal Display ("LCD") video graphics display, an electro-luminance backlight video graphics display, etc., converts the rendered output data 52 into audible and/or visual information.

In other examples, the high-speed interface 28 may exchange audio data, video data, video graphics data, and/or text data with the video decoder 38, the memory stick 40, the wireless modem 42, and/or the camcorder image sensor 44. As such, the multiple function battery operated device 10 may function as a portable MP3 player/recorder, a personal DVD player/recorder, a personal CD player/recorder, etc.

The multimedia module 24 may also receive input signals 54 from the input device 22, which may be a microphone, a keypad, a video capture device (for example, a digital camera or a digital camcorder), etc. Such input signals 54 may be video signals, audio signals, video graphics signals, and/or text signals. Upon receiving the input signals 54, the multimedia module 24, in conjunction with the processing module 30 executing a multimedia application, converts the input signals 54 into the generic digital format of the system-on-a-chip for storage in the on-chip memory or for providing to an external source via the high-speed interface 28.

As one of average skill in the art will appreciate, the system-on-a-chip may include a memory interface operably coupled to the bus 25, which is coupled to a flash memory, or the like, to extend the memory of the battery operated device 10. As such, in one embodiment, all of the video, video graphics, text, and/or audio data is stored in the on-chip memory and in another embodiment, the video, video graphics, text, and/or audio data is at least partially stored off-chip in the external memory and retrieved when needed.

As one of average skill in the art will further appreciate, when the battery operated, or handheld, device 10 is not coupled to the host device, (that is, it is in a battery powered mode) the processing module 30 executes a multimedia application 46 to detect the disconnection and to place the handheld device in a battery operation mode. In the battery operation mode, the processing module 30 retrieves, and subsequently executes, a set of operational instructions from the on-chip memory 32 to support the battery operational mode. For example, the battery operational mode may correspond to MP3 file playback, digital dictaphone recording, MPEG file playback, JPEG file playback, text messaging display, cellular telephone functionality, and/or AM/FM radio reception.

As one of average skill in the art will still further appreciate, due to the comprehensiveness of the system-on-a-chip 12, the battery-operated device 10 requires minimal additional components, thus reducing cost and complexity of the resulting device 10. Further, by including battery-optimizing techniques, the system-on-a-chip optimally consumes power to fully extend the life of the battery.

Figure 2:
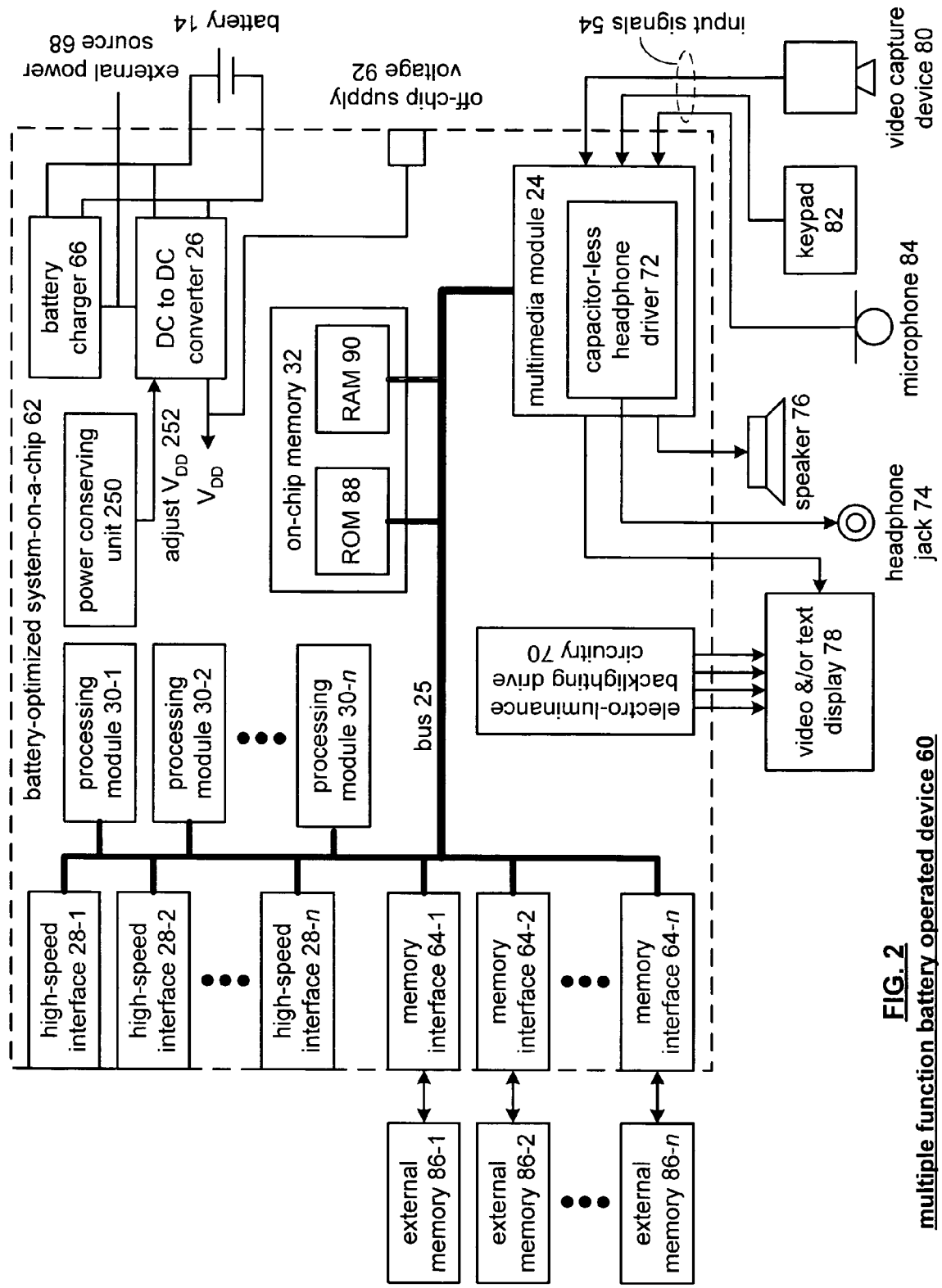
FIG. 2 is a schematic block diagram of another multiple function battery operated device that includes a battery-optimized system-on-a-chip in accordance with the present invention.

FIG. 2 is a schematic block diagram of another multiple function battery operated device 60 that includes a battery-optimized system-on-a-chip 62, a plurality of external memories 86, the battery 14, an external power source 68, a video and/or text display 78, a headphone jack 74, speaker(s) 76, a microphone 84, a keypad 82, and a video capture device 80.

The battery-optimized system-on-a-chip 62 includes a plurality of high-speed interfaces 28, a plurality of memory interfaces 64, a plurality of processing modules 30, the DC-to-DC converter 26, a battery charger 66, the on-chip memory 32, the multimedia module 24, a power conserving circuit 250 providing an adjust signal 252 (which will be described in greater detail with reference to FIGS. 3 through 12), and an electro-luminance backlighting drive circuitry 70. The multimedia module 24 includes a capacitor-less headphone driver 72. The on-chip memory 32 includes random access memory ("RAM") 90 and read only memory ("ROM") 88.

The plurality of high-speed interfaces 28-1 through 28-n allow the system-on-a-chip 62 to be simultaneously coupled to multiple external sources 34. The high-speed interfaces may utilize the same or different interface protocols. For example, all of the high-speed interfaces 28 may utilize a USB interface protocol, an Ethernet interface protocol, a fire-wire interface protocol, a serial/deserial interface protocol, etc. Alternatively, each high-speed interface 28-1 through 28-n may use a different interface protocol. For instance, high-speed interface 28-1 may support a USB interface, high-speed interface 28-2 may support Ethernet, and high-speed interface 28-n may support a fire-wire interface. One or more of the processing modules 30-1 through 30-n coordinates and arbitrates the high-speed interfaces 28 access to the bus 25.

The plurality of memory interfaces 64-1 through 64-n allow the system-on-a-chip 62 to be coupled to a plurality of external memory devices 86-1 through 86-n. The external memory devices 86-1 through 86-n may be NAND flash memory devices, NOR flash memory devices, and/or any other type of random access memory devices or read only memory devices.

While executing one or more multimedia applications, one or more of the processing modules 30 coordinates the reading and/or writing of multimedia data to and from the external memory devices 86. For instance, one of the external memory devices 86 may store MP3 files for subsequent playback, another external memory device 86, may store video files (for example, MPEG, JPEG, etc.) for subsequent playback, and another external memory device may store text and/or video graphics relating to operation of the device 60 and/or related to inputted data via the keypad 82, the video capture device 80, and/or one of the external sources 34 (see FIG. 1).

Each of the external memory devices 86 may or may not be compliant with a memory interface standard. As such, the memory interfaces 64 include a flexible topology to accommodate the various types of external memory devices 86 that may be coupled to the system-on-a-chip 62. For a detailed discussion of the functionality of the memory interfaces 64 refer to U.S. patent application entitled FLEXIBLE MEMORY INTERFACE SYSTEM, having Ser. No. 10/865,585 and a filing date of Jun. 10, 2004, which is hereby incorporated by reference.

The multimedia module 24 is operably coupled to receive input signals 54 from a microphone 84, a keypad 82, and/or a video capture device 80. The video capture device 80 may be a digital camera and/or a digital camcorder that supplies MPEG files, JPEG files, and/or other standardized format for still and/or motion digital images. The multimedia module 24 receives the digital video images from the video capture device 80 and either converts them into the generic format of the system-on-a-chip to produce generic video that are stored either in the on-chip memory 32 and/or in the external memory 86 or provides the digital video images to the bus 25 for storage in the on-chip memory 32 and/or in the external memory 86. One or more of the processing modules 30 coordinates the storing of the digital video images and whether the data will be converted to the generic format or not. The generic format may involve portioning packets of the video image into data words of a size corresponding to the bus width of the processing modules 30, storage word size of the on-chip or off-chip memory, and/or of the bus width of the bus 25.

The multimedia module 24 is also coupled to receive input signals 54 from the keypad 82. The keypad 82 may be a touch screen pad, a keyboard, voice recognition module, and/or any device that produces text messages. The multimedia module 24 receives the text messages from the keypad 82 and either processes them for display on the video and/or text display 78 or for storage in the RAM 90 and/or in the external memory 86. The processing of the text message may involve routing it to the video and/or text display 78, converting it to the generic format for storing in the RAM 90 or the external memory 86, or rendering it for display (that is, converting text information into pixel information).

The multimedia module 24 is further coupled to receive input signals 54 from the microphone 84. The multimedia module 24 converts the analog audio input signals from the microphone 84 into digital audio input signals using an encoding scheme, such as pulse code modulation ("PCM"). The multimedia module 24 provides the digital audio signals to the RAM 90 and/or the external memory 86 for storage under the control of the processing module 30, which is executing an audio recording multimedia application 46. Accordingly, in this mode, the multiple function battery operated device 60 may function as a dictaphone.

The multimedia module 24 is operably coupled to provide analog audio signals to the speaker(s) 76 and/or to the headphone jack 74. The multimedia module 24 may generate the analog audio signals by performing a PCM decoding of digital audio signals stored in the on-chip memory 32 and/or stored in the external memory 86. The multimedia module 24 includes a driver, or multiple drivers, to supply the analog audio signals to the speaker(s) 76. The multimedia module 24 also includes the capacitor-less headphone driver 72 to supply the analog audio signals to the headphone jack. The capacitor-less headphone driver 72 reduces the number of external components by eliminating the need for coupling capacitors from the on-chip drivers to the headphone jack, wherein the coupling capacitors enabled level shifting of the analog audio signals from the driver level of 0.9-volts (for example, an alternating current ("AC") ground for the left channel and right channel drivers) to 0-volts for the headphones. By reducing the number of required external components, the cost of producing a multiple function battery operated device 60 is reduced without sacrificing features and/or functionality.

The multimedia module 24 is further coupled to the video and/or text display 78, which may be an electro-luminance backlight display, an LCD display, or any other type of display that displays text, video graphics, and/or video images (still or motion). The multimedia module 24 receives digital video data from the on-chip memory and/or an external memory 86 under the control of the processing module 30, which is executing a text and/or video playback multimedia application. Upon receiving the digital video data, the multimedia module 24 converts it into pixel information (for example, RGB, YUV, YCrCb, etc.), which is provided to the video an/or text display 78.

If the display 78 is an electro-luminance backlight display, the system-on-a-chip includes the electro-luminance backlighting drive circuitry 70. In general, the electro-luminance backlighting drive circuitry 70 provides the control signals for the power transistors of the electro-luminance backlight display, thus eliminating the need for an extra integrated circuit to generate the control signals. By eliminating the need for an extra integrated circuit, the cost of producing a multiple function battery operated device 60 is reduced without sacrificing features and/or functionality.

The battery charger 66 is operably coupled to charge the battery 14 when the external source 68 is coupled to the device 10. The external source 68 may be a 5 volt supply that is received via a USB connection to a host computer or other external source having a USB connection. The details of the battery charger 66 are described in U.S. patent application entitled METHOD AND APPARATUS TO PERFORM BATTERY CHARGING USING A DC-DC CONVERTER CIRCUIT, having Ser. No. 10/675,116, and a filing date of Sep. 30, 2003, and U.S. patent application entitled OVER-VOLTAGE AND BACKFLOW CURRENT PROTECTION FOR A BATTERY CHARGER, having Ser. No. 10/675,101, and having filing date Sep. 30, 2003, both of which are hereby incorporated by reference.

Each of the processing modules 30-1 through 30-*n* may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. Further, each of the processing modules may be performing separate multimedia applications and/or co-process a single multimedia application. Such multimedia applications 46 include, but are not limited to, audio playback, audio record, video playback, video record, storing text, displaying text, storing video graphics, file system transfer, and/or displaying video graphics.

The on-chip memory 32 is shown to include ROM 88 and RAM 90. The ROM 88 may store a boot algorithm to initiate the battery-optimized system-on-a-chip 62, video graphics data, and/or any other system level data that should not be overwritten. The RAM 90 may be used as a first and/or second level cache memory for the processing modules 30 and may range from a few hundred kilobits to several hundreds megabits of storage capacity.

FIG. 3 is a schematic block diagram of a digital power conserving circuit 92 of a power conservation unit 250 (see FIG. 2) that includes a portion of an IC 100, a sensing circuit 102, and a comparator 116. The portion of the IC 100 may be a speed test circuit (for example, a plurality of gates interoperably coupled, an adder, a multiplier, ring oscillator, etc.), a critical path within the IC (for example, the path in the IC have the greatest amount of delay), and/or a replica of the critical path within the IC. The power conserving circuit 92 is provided through power conserving circuit 250, shown in FIG. 2.

In operation, the portion of the IC 100 receives a test input 106, which may be a single bit of data, an enable signal, and/or multiple bits of data having a known pattern. The sensing circuit 102 determines when the portion of the IC 100 receives the test input 106 with respect to a known clock 104. The sensing circuit 102 monitors the output of the portion of the IC 100 to determine when the test output 108 is produced. When the test output 108 is detected, the sensing circuit 102 determines the number of cycles of the known clock 104 that has passed between the portion of the IC 100 receiving the test input 106 and it producing the test output 108 to produce a count value. Alternatively, the sensing circuit 102 counts the number of iterations of performing the function during a clock cycle (for example, how many oscillations of a ring oscillator occur during a clock cycle) to determine a count value.

The sensing circuit 102 converts the count value into a measured processing speed 110 of the portion of the IC 100. For example, if the test circuit is a ring oscillator, that is, a plurality of inverters coupled in cascaded fashion, the rise and fall times can be determined based on the number of iterations in a clock cycle, where the rise and fall times can be used to determine the processing speed. The comparator 116 compares the measured processing speed 110 with a critical processing speed 112 to determine whether the supply voltage can be adjusted 114 and by how much. In general, the critical processing speed 112 corresponds to the time during which the portion of the IC must perform its function in order to avoid a timing error in the system-on-a-chip. If the measured processing time is less than the critical processing time, the supply voltage may be decreased, which slows the processing speed of the portion of the IC 100 but also reduces power consumption of the IC. This is graphically illustrated in FIGS. 4 and 5.

FIG. 4 illustrates a graph that plots supply voltage versus transistor speed, which is a key factor in determining the speed of the portion of the IC 100. As shown, from IC to IC and/or over temperature, the transistor speed with respect to supply voltage will vary. Ideally, it is desired to set the supply voltage such that the speed of the transistor (for example, rise and fall times) is at the critical speed or slightly above the critical speed. As shown, however, the speed to supply voltage may vary from IC to IC and within the same IC as the operating temperature of the IC changes. For instance, many ICs will have the nominal temperature, while a few will experience the minimum temperature, and a few will experience the maximum temperature. Without the power conserving circuit 92 (see FIG. 3), the supply voltage for all of the all ICs in this lot and in other lots would have to be set to handle the worst-case condition, where the critical processing speed is only achieved with a maximum supply voltage. As such, even though most of the ICs have a better speed to supply voltage ratio, they are operated based on the worst-case condition. Thus, they consume more power than necessary to perform their specific function since IC power consumption increases non-linearly as the supply voltage increases as shown in FIG. 5.

The power conserving circuit 92 provides an adjust signal 114 for a supply voltage on a chip-by-chip basis such that the speed of a transistor is maintained at a rate just above the critical speed. Thus, some ICs will require the supply voltage to be set at or near the maximum level, some ICs will be able to have the supply voltage set at or near the minimum level, while most will have the supply voltage set somewhere between the maximum and minimum values. Accordingly, by lowering the supply voltage for an individual IC, the power consumption for the IC is minimized.

Figure 6:
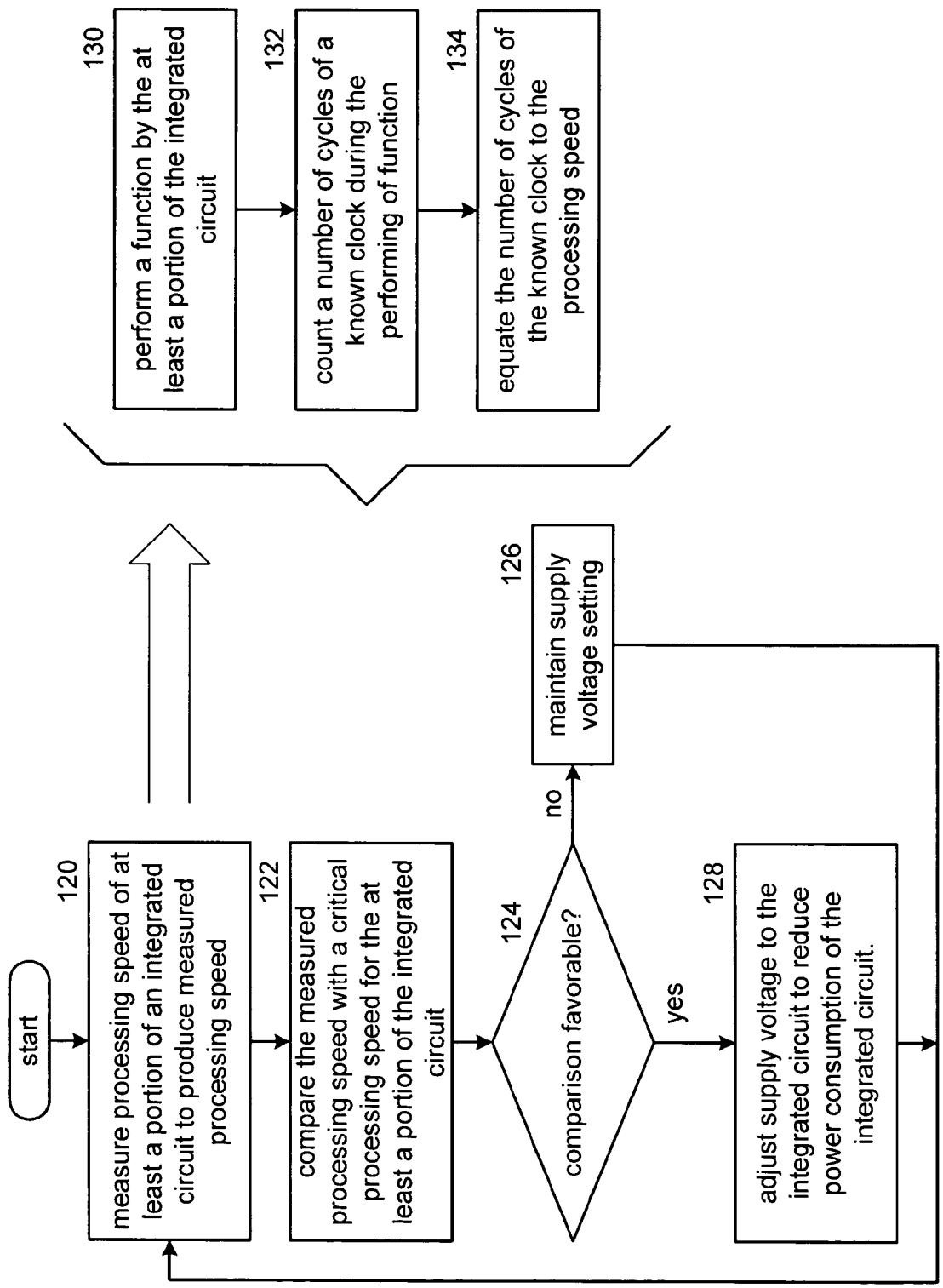
FIG. 6 is a logic diagram of a method for conserving power in accordance with the digital circuitry in accordance with the present invention.

FIG. 6 is a logic diagram of a method for conserving power of a system-on-a-chip that begins at step 120 where processing speed of at least a portion of an integrated circuit is measured to produce measured processing speed. The at least a portion of the integrated circuit includes a speed test circuit, a critical path of the integrated circuit, and/or a replicated circuit of the critical path of the integrated circuit. The measuring of the processing speed may be done as shown in steps 130 through 134. At step 130, the at least a portion of the integrated circuit performs a function, which may be, but is not limited to, an add function, a delay line function, a ring oscillation function, a memory retrieval function, and/or a multiplication function. The process then proceeds to step 132 where a number of cycles of a known clock are counted during the performing of function by the at least a portion of the integrated circuit or the number of iterations, or repetitions, of performing the function during a clock cycle to produce a count value. The process then proceeds to step 134 where the count value is equated to the processing speed.

Returning to the main path of the logic diagram, the process continues at step 122 where the measured processing speed is compared with a critical processing speed for the at least a portion of the integrated circuit. The process then proceeds to step 124 where a determination is made as to whether the comparison was favorable. If not, the process proceeds to step 126 where the supply voltage is maintained at its current setting, which initially may be set at its maximum value.

If the measured processing speed compared favorably to the critical processing speed, the process proceeds to step 128 where the supply voltage to the integrated circuit is adjusted to reduce power consumption of the integrated circuit. In one embodiment, the adjusting of the supply voltage may be done by determining a ratio between the measured processing speed and the critical processing speed and proportionally adjusting the supply voltage based on the ratio. In another embodiment, the adjusting of the supply voltage may be done by adjusting the feedback of the supply voltage for regulation of an on-chip DC-to-DC converter that produces the supply voltage, or adjusting a reference voltage used for regulation of the on-chip DC-to-DC converter that produces the supply voltage. As one of average skill in the art will appreciate, the measuring, comparing, and adjusting to update the supply voltage may be periodically performed.

FIG. 7a is a schematic diagram illustrating a process sensing channel 200 for measurement or assessment of an analog variation parameter of a portion of an IC 100 resulting from various fabrication parameters—that is, providing the ability to account for fabrication variations autonomously through the lifespan of the device. It is noted that the portions of an IC referred to herein are not to be construed as being the same, but may be other locations on the totality of the integrated circuit, and that the term "portion," as used, is to refer to something less than the entirety of the integrated circuit.

A suitable value used for assessing the analog variation parameter is the threshold voltage Vt of the IC. As shown, a diode-type field effect transistor ("FET") 202 with a known-current source 204 provides a measurement node 206, which allows measurement of the voltage of the diodeconfigured FET 202. This diod-type configuration can be implemented with n and p-type devices. The analog variation parameter is assessed by measuring the gate voltage of the transistor 202 at a point where a specific small drain current flows. An operational temperature is determined that is associated with the analog variation parameter (as discussed later in detail).

Accordingly, by assessing the analog variation parameter for the IC, the headroom voltage relating to the IC 100 is "sensed." This information regarding the analog circuitry headroom can be used in determining an adjust $V_{DD}$ signal 252 (see FIG. 2). The term "headroom voltage" is understood to be the available signal swing in analog circuitry before a performance loss becomes unacceptable, such as in signal distortion via signal size, signal quality, etc. The $AV_{DD}$ adjust signal 218 provides a mechanism for adjustment of the DC-to-DC converter 26. In this manner, the external power source 68 is optimized, thereby extending the useful lifespan of a power source to service the multiple function battery operated device 10 of FIG. 1 or the multiple function battery operated device 60 of FIG. 2.

FIG. 7b illustrates a graph that plots interrelationships of fabrication parameter corners versus headroom voltage. The illustration is general in nature, and is set forth to convey the interrelationships that are represented by the analog variation parameter for assessing the magnitude of available headroom voltage. The fabrication parameter corners generally having greater influence on device operation are generally poly sheet ρ and temperature T (through the Vt voltage). The operational temperature T and voltage $V_{DD}$ are conditional on the operational environment of the device 10 (see FIG. 1) or of the device 60 (see FIG. 2).

The analog circuitry operates within a headroom voltage, represented as the voltage between the gate and source terminals of the diode-type FET 202. With respect to the graph of FIG. 7b, the gate length L, generally does not affect the headroom voltage of the analog devices when long L devices are used. Accordingly, whether the length L is 1, or 1.1, the degree of influence to the headroom voltage is minimized in view of other factors having greater influence to the headroom voltage.

The absolute value of the threshold voltage |Vt|, as discussed above, is a fabrication process corner. As an example, presume a fabrication process has the capability of providing an IC with an absolute threshold voltage value |Vt| being 0.4 volts±0.1 volts. If the resulting value of |Vt| is at the higher range (as a result of fabrication or environmental influences such as temperature), then the transistor turns "on" at 0.5 volts instead of the 0.4 volt value. The higher the threshold voltage |Vt|, then the smaller range the drain voltage has to "swing." Also, as the threshold voltage value |Vt| increases, the available headroom voltage decreases. In other words, if an analog device can be fabricated on an integrated circuit having a lower threshold voltage |Vt|, then a higher headroom voltage is achievable.

As shown, poly sheet ρ is inversely proportional to the device bias current. Poly sheet ρ is the sheet resistance of poly silicon in units of ohms-per-square. Poly sheet is used for several things in an integrated circuit fabrication process, including resistor applications. Bias currents to the analog circuits of an integrated circuit are typically the band-gap voltage divided by a poly resistor. That is, the current I equals the band-gap voltage divided by a resistance R, where resistance R is poly sheet ρ times length divided by width. The bias currents are inversely proportional to poly sheet ρ. The relationship to the headroom voltage for the analog circuitry is that increase bias currents in turn can limit the headroom voltage.

Though the poly sheet ρ parameter does not have a large influence to the performance of the digital circuits of an integrated circuit, it does affect the headroom voltage for analog operation. Accordingly, if poly sheet ρ is low, there is more current, and the biasing of each device is larger, diminishing the headroom voltage.

With the operational temperature T, the absolute value of the threshold voltage |Vt| trends downward as the as the operational temperature T increases. The opposite effect results as the operational temperature T decreases, causing the absolute value of the threshold voltage |Vt| to increase. Thus, for low temperature, a higher threshold voltage |Vt| results, leaving less capacity for headroom voltage.

FIG. 8 is a schematic block diagram of an analog power conserving circuit 209 that includes a portion of an IC 100, a process sense module 208, an operational temperature sensor 210, and an analog $V_{DD}$ ($AV_{DD}$) look-up table 214. The portion of the IC 100, for example, may be an operational amplifier circuit.

In operation, the process sense module 208 senses the analog variation parameter of the IC 100 portion, and provides an analog parameter signal 215. The operational temperature sensor 210 senses the operational temperature of an IC 100 portion. This value is associated with the analog variation parameter determination of the process sense module 208. The operational temperature sensor 210 provides a temperature signal 216. The $AV_{DD}$ look-up table 214 has inputs that receive the analog variations parameter signal 215 and the temperature signal 216.

The analog variations parameter signal 215 provides a signal representation interaction of the fabrication parameters and the operational parameters with the magnitude of available headroom voltage. The operational parameters being represented in the analog variations parameter signal 215 are generally those set out in the graph of FIG. 7b that plots interrelationships of fabrication parameter corners versus headroom voltage, including the poly sheet ρ.

The $AV_{DD}$ look-up table 214, based on inputs from the analog variations parameter signal 215 and the operational temperature signal input 216, provides an analog $V_{DD}$ ($AV_{DD}$) adjust signal 218. The $AV_{DD}$ look-up table 214 may also be provided as a memory device operably connected to a microprocessor, or provided as a logic circuit, that contains information and data representing the represents the threshold voltage curve, the operational temperature curve, and voltage $V_{DD}$ curve with respect to the headroom voltage plot shown in FIG. 7b. With this information, an $AV_{DD}$ adjust signal 218 is generated responsive to the analog variations parameter signal 215, based on the operational temperature signal 216.

With respect to analog circuitry on the IC 100, the $AV_{DD}$ adjust signal 218 is accepted by a DC-to-DC converter 26, which is operably coupled to the battery 14 and inductor 16 (see FIG. 2) to produce at least one supply voltage for analog circuitry ($V_{DD}$). In general, the DC-to-DC converter 26 may be a buck converter, a boost converter, a fly-back converter, a half bridge converter, and/or a full bridge converter. Note that the DC-to-DC converter can also be an inductor-less configuration including a linear regulator and/or a switched-capacitor regulator.

Through normal use and operation, the multiple function battery operated device 10 or device 60 is subjected to varying environmental conditions. Accordingly, the adjustment signal 218 can be updated by repeating the determination of at least one of the operational temperature T and the analog variation parameter conveyed by the analog parameter signal 215, which can be conducted by the operational temperature sensor 210, and the process sense module 208, respectively.

Figure 9:
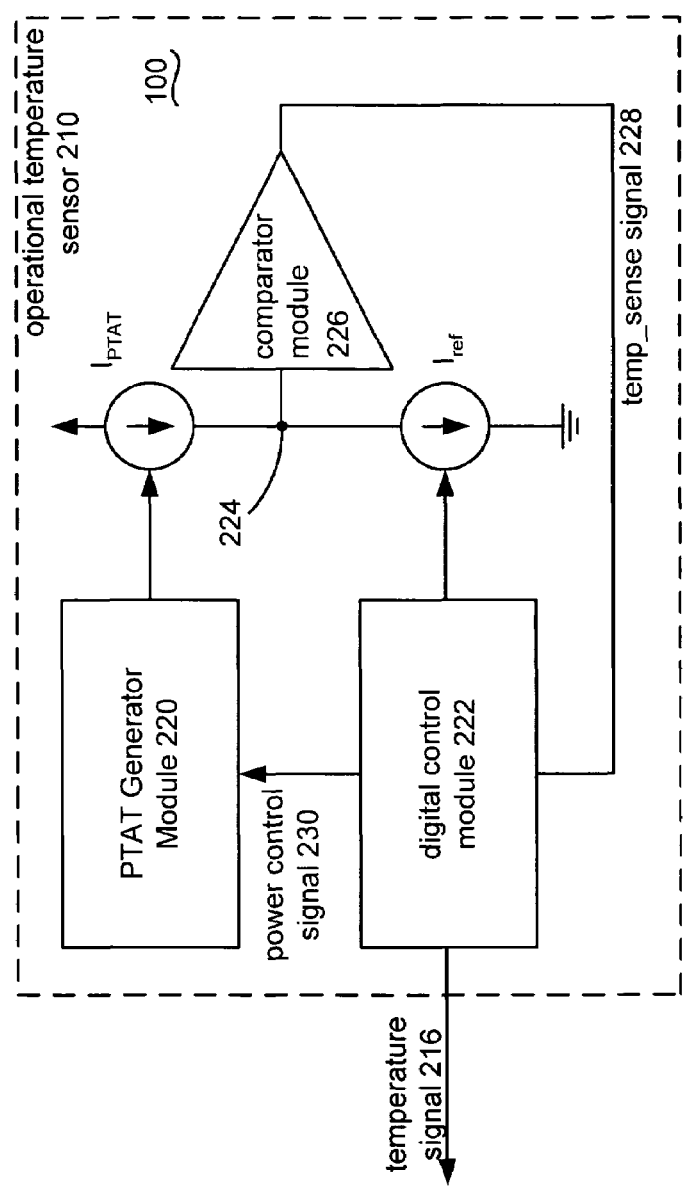
FIG. 9 is a schematic diagram of the operational temperature sensor in accordance with the present invention.

FIG. 9 illustrates a schematic block diagram of an operational temperature sensor 210 for deployment on a portion of an integrated circuit 100. The operational temperature sensor 210 determines the operational temperature T associated with an analog variation parameter for the integrated circuit 100.

Due to the supply voltage optimization, the temperature sensor configuration used should be sensitive to temperature but sufficiently immune to other deviations, including power supply voltage variation. Sufficient immunity to deviations can be provided via reference structures such as that of FIG. 9, or variable-compensation techniques or other suitable techniques that account for variable deviation.

The temperature sensor 210 has a proportional-to-absolute-temperature ("PTAT") generator module 220, and a digital control module 222. Generally, the temperature sensor 210 of FIG. 9 provides a temperature signal 216 that is based on a comparison conducted between current sources $I_{PTAT}$ and $I_{ref}$ provided at node 224. The comparison is provided by the comparator module 226.

The PTAT generator module 220 provides a current source $I_{PTAT}$. The current source $I_{PTAT}$, as suggested, has a magnitude that is proportional to absolute temperature that changes as the temperature T of the portion of the IC 100 changes. The digital control module 222 provides a temperature signal 216. Also, the digital control module 222 provides a reference current source $I_{ref}$, which is a fixed current that is independent of temperature, thus providing a constant reference current function having the property of never increasing and of never decreasing as the value of the temperature T increases or otherwise changes. The digital control module 222 contains a register that outputs, through the temperature signal 216, a value representative of an operational temperature T of the portion of the IC 100.

Figure 10:
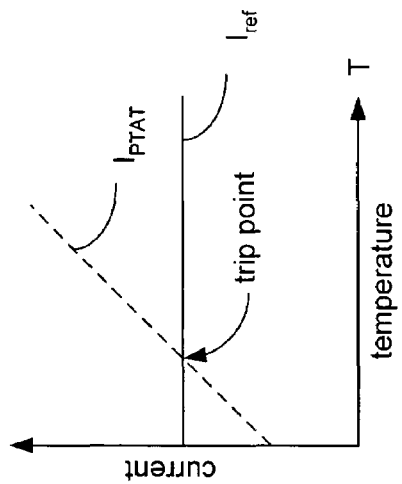
FIG. 10 is a graph of current versus temperature that illustrates the operation of the operational temperature sensor of FIG. 9.

FIG. 10 is a graph that plots current versus temperature for illustrating the operation of the operational temperature sensor 210 and via the relationship of the reference current $I_{REF}$ and the variable current $I_{PTAT}$. As shown in FIG. 10, reference current $I_{REF}$ is substantially constant with respect to temperature T. Reference to FIG. 9 will be made for discussion of the graph of FIG. 10.

To begin, the current source $I_{REF}$ is less than the magnitude of the variable current $I_{PTAT}$. An output of the comparator module 226 provides a logic "low" value to the digital control module 222 via a temp_sense signal 228. The digital control module 222 operates at a speed designated by a clock signal.

The digital control module 222 senses the temp_sense signal 228, and updates an up/down counter to reflect the status of the temp_sense signal 228 with respect to iterations of the clock signal. The digital control module 222 incrementally increases the reference current $I_{REF}$ for sampling at the next clock cycle of the clock signal the temp_sense signal 228. This process of incrementing the reference current $I_{REF}$ continues until a trip point is achieved. The trip point occurs when the reference current $I_{REF}$ intersects the variable current $I_{PTAT}$. In other words, where the reference current $I_{REF}$ is substantially equal to the variable current $I_{PTAT}$ at node 224, causing the comparator module 226 to trip. Upon tripping, the temp_sense signal 228 of the comparator module 226 transitions to a logic "high" value, indicating "temperature found" to the digital control module 222.

With a logic high value provided by the temp_sense signal 228, the up/down counter of the digital control module 222 stops incrementing with respect to the logic low value of the temp_sense signal 228 and iterations of the clock signal. The contents of the up/down counter are latched and are provided to the look-up table 214 (see FIG. 8) by the temperature signal 216. The digital control module 222 then powers down the PTAT generator module 220 through power control signal 230.

As can be readily appreciated, other circuits or configurations can be implemented for assessment of the operational temperature T. As a further alternative, operational temperature T may be estimated based upon a difference of the values of the analog parameter signal 215 over time. That is, the estimate, or inference, can be used as an indicator of temperature or temperature difference. These inferences can be processed with the analog parameter signal 215 for generation of an $AV_{DD}$ adjust signal 218 from the $AV_{DD}$ look-up table 214. Such an inference of the operational temperature, however, would not provide the level of accuracy otherwise available through the operational temperature sensor 210 of FIG. 9.

Figure 11:
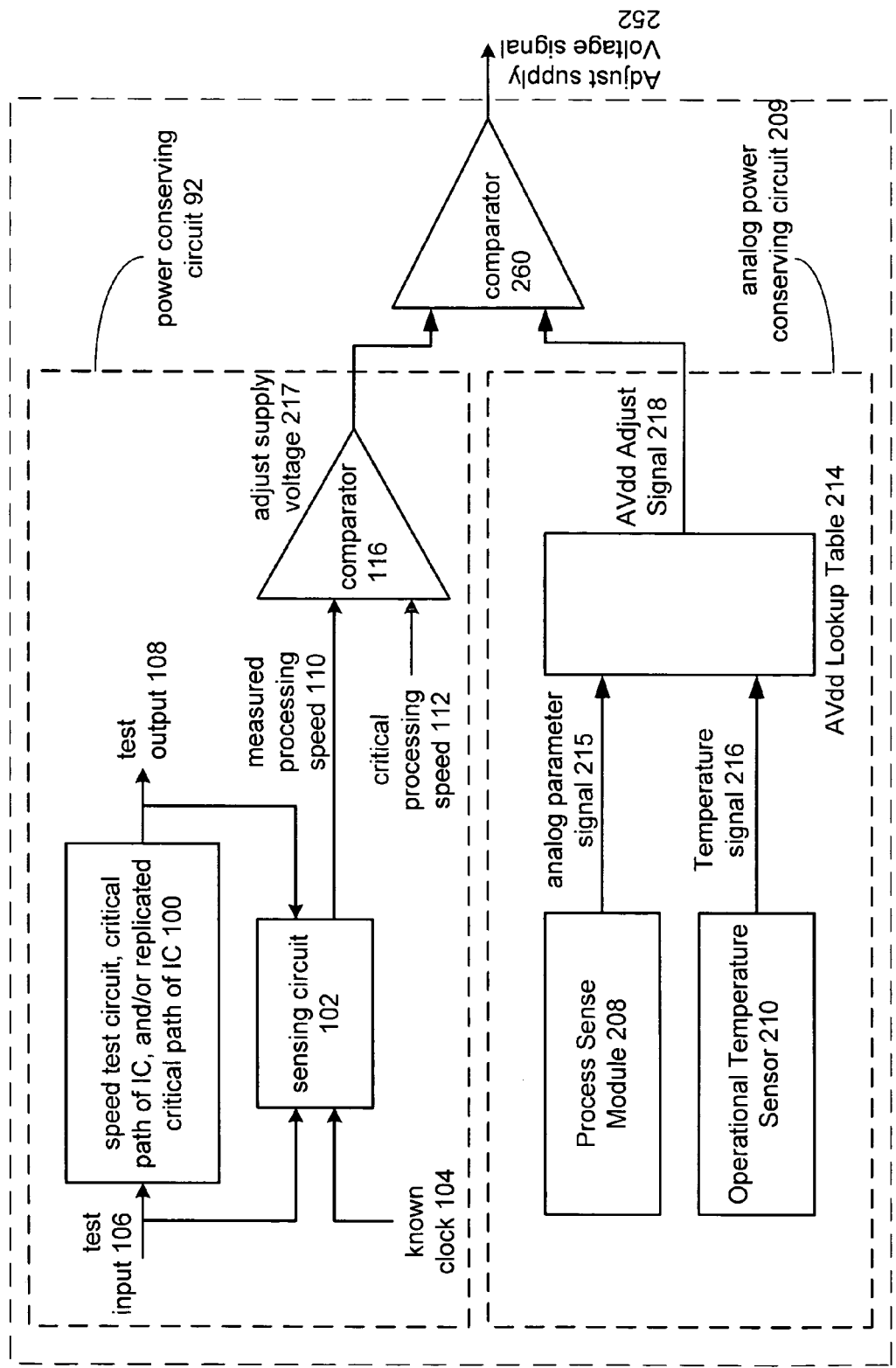
FIG. 11 is a schematic block diagram of a power conserving circuit having a first component for assessing power conservation for a digital circuit, and a second component for assessing power conservation for an analog circuit in accordance with the present invention.

FIG. 11 is a schematic block diagram showing a power conserving circuit 250 that provides an adjust supply voltage signal 252 for a shared voltage source supplying power to the analog and the digital circuitry of the battery-optimized system-on-chip 62 (see FIG. 2).

The power conserving circuit 250 has a component addressing digital circuitry power optimization-power conserving circuit 92, and a second component addressing analog circuitry power optimization-analog power conservation circuit 209. Each optimization circuit provides respective inputs to the comparator 260. The comparator provides an adjust supply voltage signal 252.

In operation, the comparator 260 determines the greater of the input values provided. That is, a selection of the digital adjust supply voltage 217 representing the digital variation parameter, or of the $AV_{DD}$ adjust signal 218 representing the analog variation parameter with respect to the operational temperature T. In other words, the determination is that when the first, or digital, adjust supply voltage signal 114 compares favorably with the second, or $AV_{DD}$, adjust signal 218, then the first, or digital, adjustment signal is selected as the adjust supply voltage signal 252. Otherwise, the second, or $AV_{DD}$, adjustment signal is selected as the adjust supply voltage signal 252.

The adjust supply voltage signal 252 is accepted by a DC-to-DC converter 26, which is operably coupled to the battery 14 and inductor 16 to produce a supply voltage $V_{DD}$ to the circuitry of the battery-optimized system-on-chip 62. In general, the DC-to-DC converter may be a buck converter, a boost converter, a fly-back converter, a half bridge converter, and/or a full bridge converter. Note that the DC-to-DC converter can also be an inductor-less configuration including a linear regulator and/or a switched-capacitor regulator.

Through use and operation, the multiple function battery operated device 10 is subjected to varying environmental conditions. Accordingly, the adjustment signal 252 can be updated by repeating the determination of at least one of the operational temperature T and the analog variation parameter, which can be conducted by the operational temperature sensor 210, and the process sense module 208, respectively.

Figure 12A:
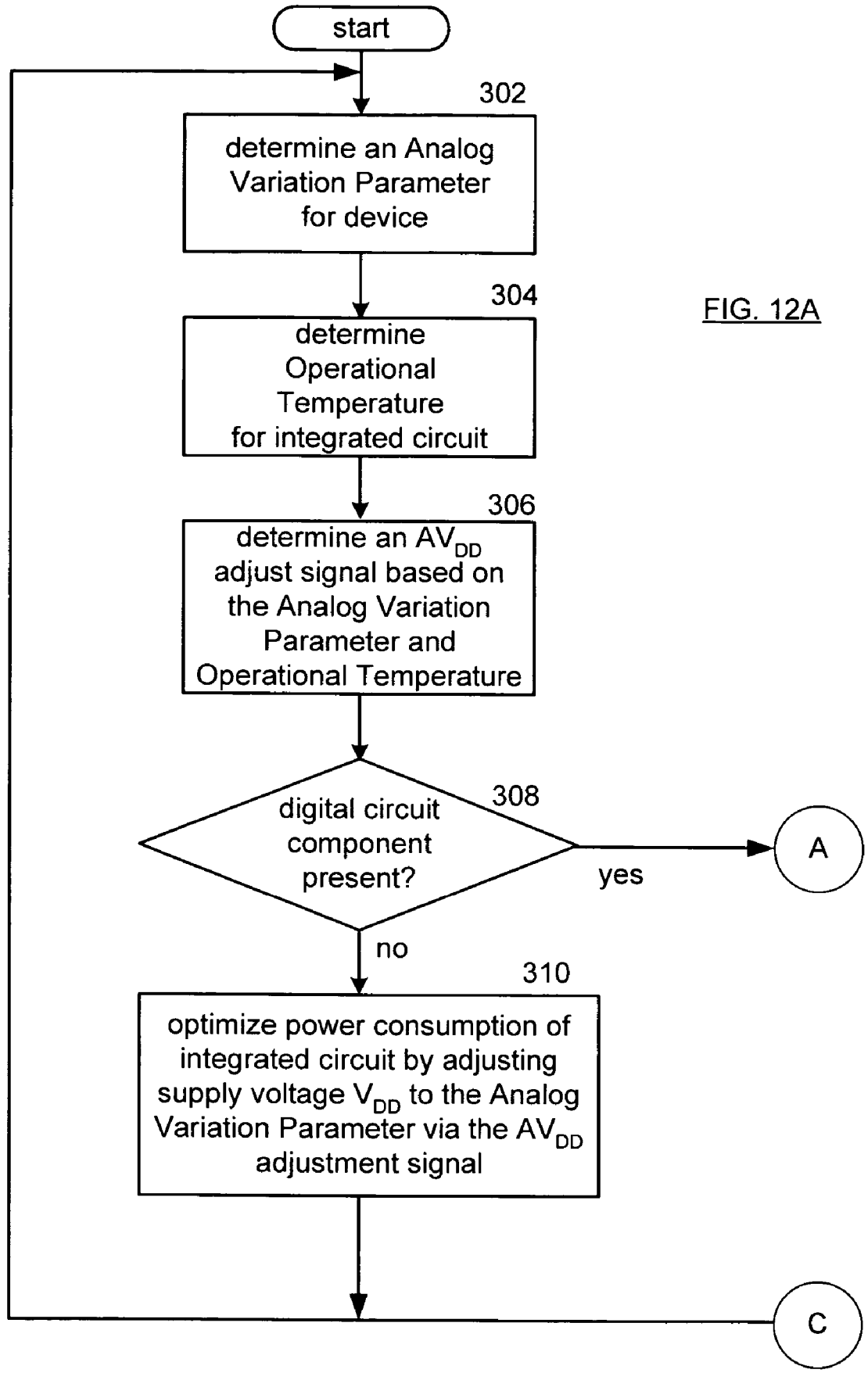
FIGS. 12a, 12b, and 12c are a logic diagram for a method for conserving power for a mixed signal integrated circuit in accordance with the present invention.
Figure 12B:
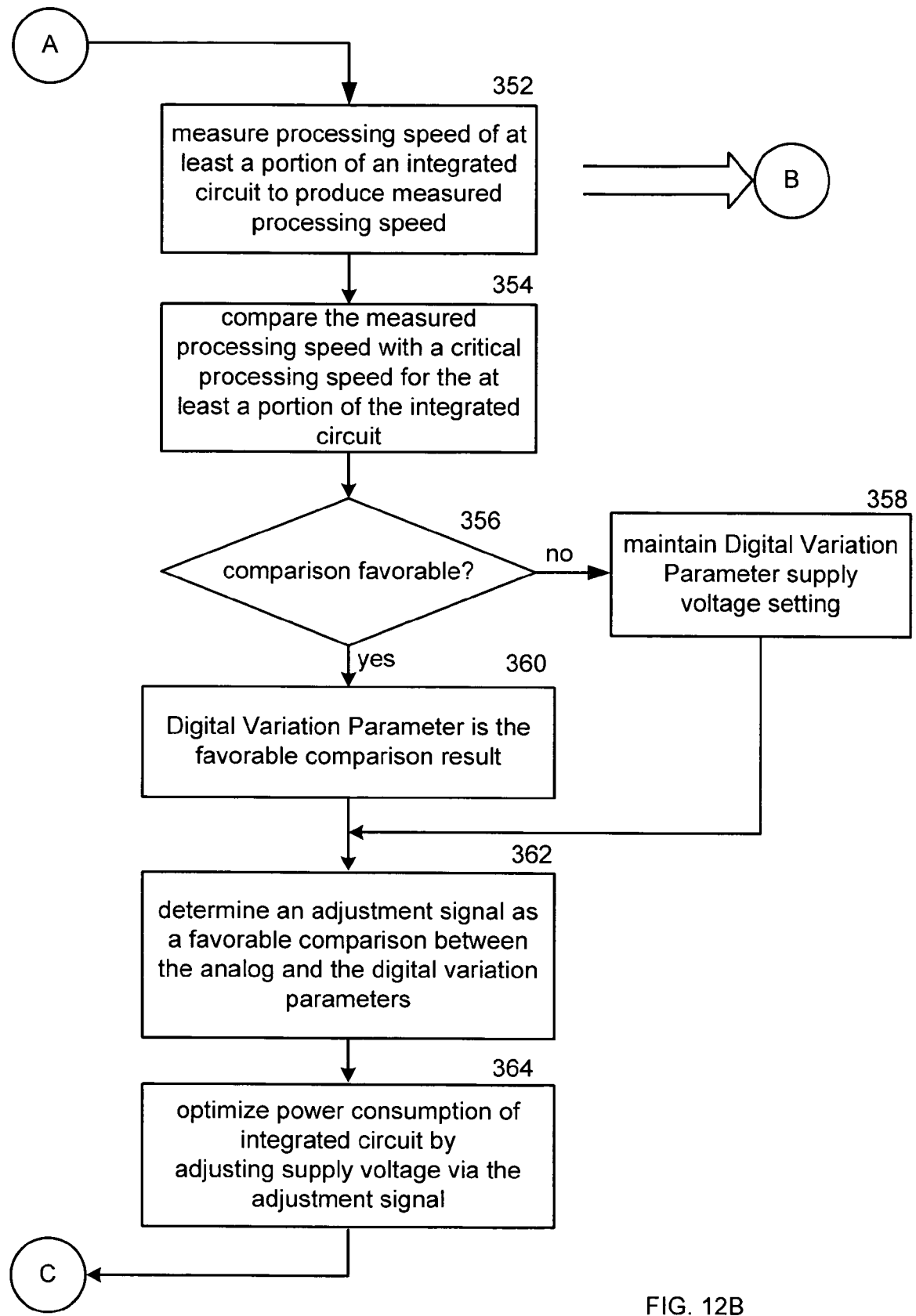
Figure 12C:
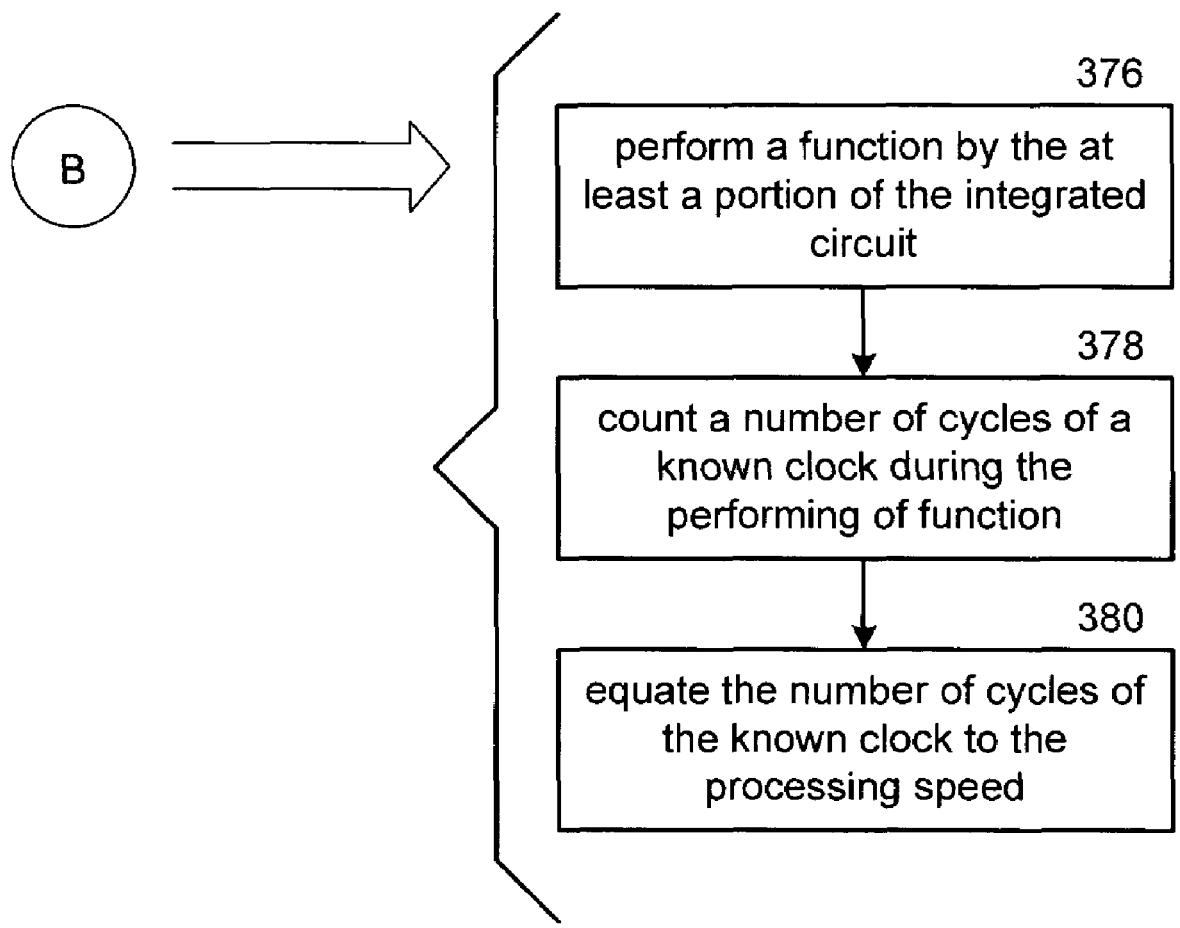

FIGS. 12a, 12b, and 12c provide a logic diagram of a method for conserving power of a system-on-a-chip that begins at step 302 where the analog variation parameter is determined, representing fabrication process variations to the IC. Step 304 determines the operational temperature T of the integrated circuit. At step 306, determination of the analog voltage level ($AV_{DD}$) signal is conducted based on the analog variation parameter with respect to the operational temperature T.

At step 308, if a digital component is present on the integrated circuit, or present for a shared power supply with the analog component of the integrated circuit, then the method proceeds to step 352 (see FIG. 12b). If not, indicating that either there is no digital component for the power supply to allocate appropriate energy resources (either by not being present, or the digital component has a devoted power channel), the method proceeds to step 310 where the power consumption of the IC is optimized by adjusting the supply voltage $V_{DD}$ to the analog voltage level $AV_{DD}$ signal. The process then can be repeated by returning to step 302.

If a digital component is present, as determined at step 308 at FIG. 12a, the method continues to step 352 of FIG. 12b where processing speed of at least a portion of an integrated circuit is measured to produce measured processing speed. The at least a portion of the integrated circuit includes a speed test circuit, a critical path of the integrated circuit, and/or a replicated circuit of the critical path of the integrated circuit. The measuring of the processing speed may be done as shown in FIG. 12c as steps 376 through 380. At step 376, the at least a portion of the integrated circuit performs a function, which may be, but is not limited to, an add function, a delay line function, a ring oscillation function, a memory retrieval function, and/or a multiplication function. The process then proceeds to step 378 where a number of cycles of a known clock are counted during the performing of function by the at least a portion of the integrated circuit or the number of iterations, or repetitions, of performing the function during a clock cycle to produce a count value. The process then proceeds to step 380 where the count value is equated to the processing speed.

Returning to the main path of the logic diagram of FIG. 12b, the process continues at step 354 where the measured processing speed is compared with a critical processing speed for the at least a portion of the integrated circuit. The process then proceeds to step 356 where a determination is made as to whether the comparison was favorable. If not, the process proceeds to step 358 where the digital variation parameter is maintained at its current setting.

If the comparison is favorable, then in step 360 the digital variation parameter is the favorable comparison result from step 356. In one embodiment, the adjusting of the supply voltage may be done by determining a ratio between the measured processing speed and the critical processing speed and proportionally adjusting the supply voltage based on the ratio. In another embodiment, the adjusting the supply voltage may be done by adjusting the feedback of the supply voltage for regulation of an on-chip DC-to-DC converter that produces the supply voltage, or adjusting a reference voltage used for regulation of the on-chip DC-to-DC converter that produces the supply voltage.

In step 362 determination of an adjustment signal as based on the analog variation parameter with respect to the operational temperature against the digital variation parameter. In this instance a comparison is made between the analog variation parameter and the digital variation parameter. The adjustment signal is the favorable result. At step 364 optimization, or reduction, of power consumption of the integrated circuit is accomplished by adjusting the supply voltage via the adjustment signal selected as the favorable result.

As one of average skill in the art will appreciate, the measuring, comparing, and adjusting to update the supply voltage may be repeatedly performed, as indicated by the return of the method to step 302 (see FIG. 12a).

The preceding discussion presents a method and apparatus for conserving power on an IC-by-IC, or chip-by-chip, basis, and over time. In a first aspect, this is achieved by measuring the processing speed of the IC, comparing the measured processing speed with a critical processing speed, and if the measured processing speed is faster than the critical processing speed, decreasing the supply voltage such that the actual processing speed approaches the critical processing speed. In another aspect, power optimization, or conservation, is achieved by determining an analog variation parameter with respect to an operational temperature, decreasing the supply voltage such that a sufficient headroom voltage for analog signal performance is provided. In yet another aspect, the digital variation parameter—as set out as the value representative of the actual processing speed approaches the critical processing speed, is compared with the analog variation parameter. The resulting favorable comparison provides a basis to decrease or optimize the supply voltage. As one of average skill in the art will appreciate, other embodiments may be derived from the teachings of the present invention without deviating from the scope of the claims.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (that is, where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1 (see FIG. 1).

What is claimed is:

1. A method for power supply optimization of an integrated circuit, comprising:
   determining an analog variation parameter representative of an integrated circuit fabrication process variance of the integrated circuit;
   determining an operational temperature associated with the analog variation parameter; and
   determining an adjustment signal for a power supply voltage level of the integrated circuit based on the analog variation parameter with respect to the operational temperature; and adjusting a regulation signal of a DC-to-DC converter based on the adjustment signal to optimize power consumption of the integrated circuit.

2. The method of claim 1 further comprises:
updating the adjustment signal by repeating at least one of the determination of the operational temperature and determining the adjustment signal.

3. The method of claim 1, wherein the determining the adjustment signal further comprises:
determining a digital variation parameter; and
determining the adjustment signal based on the digital variation parameter and the analog variation parameter with respect to the operational temperature.

4. The method of claim 3 wherein the determining the adjustment signal comprises:
determining a first adjustment signal based on the analog variation parameter;
determining a second adjustment signal based on the digital variation parameter;
comparing the first adjustment signal to the second adjustment signal; and
when the first adjustment signal compares favorably with the second adjustment signal, selecting the first adjustment signal as the adjustment signal, else the second adjustment signal as the adjustment signal.

5. The method claim 3, wherein determining a digital variation parameter comprises:
measuring processing speed of at least a portion of an integrated circuit to produce measured processing speed;
comparing the measured processing speed with a critical processing speed for the at least a portion of the integrated circuit; and
when the measured processing speed compares favorably to the critical processing speed, correspondingly set a value of the digital variation parameter.

6. The method of claim 3 further comprises:
adjusting a regulation signal of a DC-to-DC converter based on the adjustment signal.

7. The method of claim 6 further comprises:
updating the adjustment signal by repeating at least one of the determination of the operational temperature, the determination of the analog variation parameter, and of the digital variation parameter.

8. An apparatus for increasing power supply efficiency of an integrated circuit comprises:
a processing module; and
a memory operably coupled to the processing module, wherein the memory stores operational instructions that cause the processing module to:
determine an analog variation parameter representative of an integrated circuit fabrication process variance of the integrated circuit;
determine an operational temperature associated with the analog variation parameter; and
determine an adjustment signal for a power supply voltage level of the integrated circuit based on the analog variation parameter and the operational temperature; and
adjust a regulation signal of a DC-to-DC converter based on the adjustment signal to optimize power consumption of the integrated circuit.

9. The method of claim 8, wherein the memory further stores operational instructions that cause the processing module to:
update the adjustment signal by repeating at least one of the determination of the operational temperature and determine the analog variation parameter.

10. The apparatus of claim 8, wherein the memory further stores operational instructions that cause the processing module to determine the adjustment signal by:
determine a digital variation parameter; and
determine the adjustment signal based on the digital variation parameter and the analog variation parameter with respect to the operational temperature.

11. The apparatus of claim 10, wherein the memory further stores operational instructions that cause the processing module to determine the digital variation parameter by:
measuring a processing speed of at least a portion of an integrated circuit to produce measured processing speed;
comparing the measured processing speed with a critical processing speed for the at least a portion of the integrated circuit; and
when the measured processing speed compares favorably to the critical processing speed, set a corresponding value of the digital variation parameter.

12. The apparatus of claim 10, wherein the memory further stores operational instructions that cause the processing module to:
adjust a regulation signal of a DC-to-DC converter based on the adjustment signal.

13. The apparatus of claim 11, wherein the memory further stores operational instructions that cause the processing module to:
determine a first adjustment signal based on the analog variation parameter;
determine a second adjustment signal based on the digital variation parameter;
compare the first adjustment signal to the second adjustment signal; and
when the first adjustment signal compares favorably with the second adjustment signal, selecting the first adjustment signal as the adjustment signal, else selecting the second adjustment signal as the adjustment signal.

14. A comprehensive system-on-a-chip comprises:
a processing core operably coupled to process input digital data and produce therefrom output digital data;
digital interface circuitry operably coupled to provide the input digital data to the processing core and to receive the output digital data from the processing core;
mixed signal circuitry operably coupled to convert input analog signals into the input digital data and to convert the output digital data into output analog signals; and
battery optimization circuitry that includes a DC-to-DC converter and a power conservation circuit, wherein the DC-to-DC converter is operably coupled to convert a battery voltage into a supply voltage that supplies at least one of: the processing core, the digital interface circuitry, and the mixed signal circuitry, wherein the power conservation circuit includes:
processing module; and
memory operably coupled to the processing module, wherein the memory stores operational instructions that cause the processing module to:
determine an analog variation parameter representative of an integrated circuit fabrication process variance of the integrated circuit;
determine an operational temperature associated with the analog variation parameter;
determine a digital variation parameter representative of a processing speed of the integrated circuit; and determine an adjustment signal for a power supply voltage level of the integrated circuit based on the analog variation parameter with respect to the operational temperature and the digital variation parameter; and adjusting a regulation signal of a DC-to-DC converter based on the adjustment signal to optimize power consumption of the integrated circuit.

15. The comprehensive system-on-a-chip of claim 14, wherein the memory further stores operational instructions that cause the processing module to:

update the regulation adjustment by repeating at least one of the determination of the operational temperature and the determination of the analog variation parameter.

16. The comprehensive system-on-a-chip of claim 15, wherein the memory further stores operational instructions that cause the processing module to adjust of the supply voltage by:

determining the digital variation parameter as a ratio between the measured processing speed and the critical processing speed; and adjusting the supply voltage based on an operational sufficiency of either the digital variation parameter or the analog variation parameter with respect to the operational temperature.

17. The comprehensive system-on-a-chip of claim 14, wherein the memory further stores operational instructions that cause the processing module to measure the processing speed by:

enabling a function to be performed by the at least a portion of the comprehensive system-on-a-chip;

counting at least one of a number of cycles of a known clock during the performing of function by the at least a portion of the integrated circuit and a number of repetitions of the function during a cycle of the known clock to produce a count value; and equating the count value to the processing speed.

18. A method for increasing power supply efficiency of an integrated circuit, comprising:

determining an analog variation parameter representative of an integrated circuit fabrication process variance of the integrated circuit; and determining an adjustment signal for a power supply voltage level of the integrated circuit based on the analog variation parameter; and adjusting a regulation signal of a DC-to-DC converter based on the adjustment signal to optimize power consumption of the integrated circuit.

19. The method of claim 18, wherein the determining the adjustment signal further comprises:

determining an operational temperature associated with the analog variation parameter; and determining an adjustment signal for a power supply voltage level of the integrated circuit based on the analog variation parameter with respect to the operational temperature, such that power consumption of the integrated circuit is optimized.

20. The method of claim 19 further comprises:

determining a digital variation parameter; and determining the adjustment signal based on the digital variation parameter and the analog variation parameter with respect to the operational temperature.

21. The method of claim 20 wherein the determining the adjustment signal comprises:

determining a first adjustment signal based on the analog variation parameter;

determining a second adjustment signal based on the digital variation parameter;

comparing the first adjustment signal to the second adjustment signal; and when the first adjustment signal compares favorably with the second adjustment signal, selecting the first adjustment signal as the adjustment signal, else the second adjustment signal as the adjustment signal.

* * * * *